United States Patent

Selinger et al.

Patent Number: 6,101,710
Date of Patent: *Aug. 15, 2000

[54] METHOD FOR FACILITATING ENGINEERING CHANGES IN A MULTIPLE LEVEL CIRCUIT PACKAGE

[75] Inventors: Craig Richard Selinger, Spring Valley; Timothy Allen Schell, Poughkeepsie; Michael Lee Hackett, Hyde Park, all of N.Y.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/764,774

[22] Filed: Dec. 12, 1996

Related U.S. Application Data

[63] Continuation-in-part of application No. 08/355,946, Dec. 14, 1994, abandoned.

[51] Int. Cl.$^7$ .................................................. H05K 3/02
[52] U.S. Cl. ............................................. 29/847; 29/846
[58] Field of Search .................... 29/846, 847; 174/250, 174/251, 255, 260, 261; 257/530, 209, 210, 211; 361/748, 760, 772, 773, 774, 777, 778, 779, 781, 782, 783; 439/44, 49, 50, 54, 55, 65, 68, 69, 74, 876

[56] References Cited

U.S. PATENT DOCUMENTS

| | | | |
|---|---|---|---|
| 3,634,731 | 1/1972 | Skogmo | 317/101 A |
| 4,489,364 | 12/1984 | Chance et al. | 361/777 |
| 4,652,974 | 3/1987 | Ryan | 361/777 |
| 4,722,084 | 1/1988 | Morton | 371/9 |
| 5,184,284 | 2/1993 | Ashelin et al. | 361/760 |
| 5,360,767 | 11/1994 | Narayanan et al. | 437/250 |

OTHER PUBLICATIONS

IBM Technical Disclosure Bulletin "Silicon Elevated, Wireless Module Method For Making Engineering Changes" vol. 31 No. 10 pp. 71–74, Mar. 1989.

IBM Technical Disclosure Bulletin, "Verification and Implementation of Post–Manufacturing Chip Design Change" by T.A. Bellwood, et al., vol. 36, No. 07, Jul. 1993, pp. 27–31.

IBM Technical Disclosure Bulletin, "Spare I/O Preparation for Use at Release Interface Tape B" by J.J. Sanders, et al., vol. 34, No. 10A, Mar. 1992, pp. 186–190.

*Primary Examiner*—Lee Young
*Assistant Examiner*—Rick Kiltae Chang
*Attorney, Agent, or Firm*—Alison D. Mortinger; Graham S. Jones, II; Jay H. Anderson

[57] ABSTRACT

An anticipation of engineering changes to a multiple-level integrated circuit package, resulting in a significant decrease in the turnaround time required to make engineering changes. After the first pass of the design phase is complete and before manufacture has begun, surplus I/O at different package levels are wired into surplus connections involving all but the highest package level. These surplus connections are reserved for future use when engineering changes become necessary. Once manufacture is complete, the surplus connections can be converted into logical connections by ECing only the highest packaging level with the quickest turnaround time. The surplus connections also provide a means for implementing ongoing incremental engineering changes as they are needed.

10 Claims, 2 Drawing Sheets

METHOD FOR FACILITATING ENGINEERING CHANGES IN A MULTIPLE LEVEL CIRCUIT PACKAGE

The application is a continuation, of application Ser. No. 08/355,946, filed Dec. 14, 1994, now abandoned.

BACKGROUND

1. Field

This invention is directed to a method or apparatus for making engineering changes to integrated circuit packages. It is directed more particularly to providing for quick turnaround engineering changes involving more than one level of a multiple-level circuit package, and also to allow for ongoing incremental engineering changes.

High density integrated circuit packaging involves a hierarchy of packaging levels. A typical multi-level hierarchy involves integrated circuit chips (the highest level) mounted on circuit modules, with the modules mounted on printed circuit cards, and the cards mounted on printed circuit boards (the lowest level). A card or a board can be connected to another card or board by a cable. A level can be omitted, for example chips can be mounted directly on cards or boards, and modules can be mounted on boards. When design changes become necessary, an engineering change (EC) will frequently involve more than one packaging level.

When an EC involves more than one packaging level, the turnaround time to complete the EC is gated by the turnaround time of the slowest EC. Chip ECs are relatively quick, with the advent of FIB, or Focussed Ion Beam process, as explained in IBM Technical Disclosure Bulletin Vol. 36 No 7 July 1993 by Bellwood et al. entitled "Verification and Implementation of Post-Manufacturing Chip Design Change" and incorporated herein in its entirety. The FIB process avoids changing masks and rebuilding the chip. It involves blasting a hole in the chip with a laser, cutting connections, or adding connections with ion implantation and closing the hole. As a result, chip ECs can be completed in a few days. Module and card ECs are more complex and take months, while board ECs can take three times as long as modules or cards. Prior to this invention, a board EC involved adding, deleting, or otherwise modifying a wired connection on a board, as well as ECing at least one module or card on that board. The board EC usually entails disconnecting a board wire from the board via. The wire may then be drilled out, backfilled with an insulated connection, and discretely wired on the bottom surface of the board. Thus even if the EC process for the different packages involved is performed in parallel, the total time to EC will still be the time for the slowest package EC, which typically involves the lowest level of packaging.

2. Prior Art

Previous inventions have attempted to provide a way of making engineering changes to circuit and module designs. Programmable gate arrays provide a layout of predefined gates in a chip which are customized, or "burned in" by applying external signals. Memory chips use redundant memory blocks and spare data lines to support repairs of defects. Other inventions make changes in the wiring pattern of a printed circuit board by attaching an auxiliary board. Yet other inventions add new chips or components by attaching a card or board to a module. Inventions addressing two-level package hierarchies with chips mounted on a module make changes with EC lines buried in the module and customizable surface connections to the chips, for example in U.S. Pat. No. 4,489,364 issued Dec. 18, 1984 to Chance, et al and incorporated by reference herein in its entirety.

Spare I/O was the focus of an IBM Technical Disclosure Bulletin Vol. 34, No. 10A, March 1992, by Sanders et al entitled "Spare I/O Preparation for Use at Release Interface Tape B." Sanders' method applied to a specific module and called for setting up spare I/O as common I/O configured as a control or data net. The method did not add surplus connections, nor did it apply to connections other than data lines; it utilized unused drivers and receivers on two chips rather directly using surplus I/O at any level of packaging hierarchy. This method addressed the goal of reducing product design cycles but like other inventions failed to provide quick turnaround post-manufacture engineering changes across multiple levels of integrated circuit packaging and the ability to support ongoing incremental engineering changes.

SUMMARY OF THE INVENTION

The invention deals with anticipating engineering changes to a multiple-level integrated circuit package. The improvements which have been made achieve a significant decrease in the turnaround time required to make engineering changes to (EC) such a package. These improvements are accomplished after the first pass of the design phase is complete and before manufacture has begun. After the first pass design is done, the designer is able to target specific areas of the design that will be susceptible to future change. Connections to the target area are identified, as well as endpoints for those connections. Surplus input/output (I/Os) at each packaging level are then identified and wired in surplus connections involving all but the highest package level. These surplus connections are reserved for future use when engineering changes become necessary. Once manufacture is complete, the surplus connections can be converted into logical connections by ECing only the highest packaging level with the quickest turnaround time. The surplus connections also provide a means for implementing ongoing incremental engineering changes or adding additional functions to an existing design.

These and other improvements are set forth in the following detailed description. For a better understanding of the invention with advantages and features, refer to the description and to the drawings.

DESCRIPTION OF THE PREFERRED EMBODIMENTS

Figure 1:
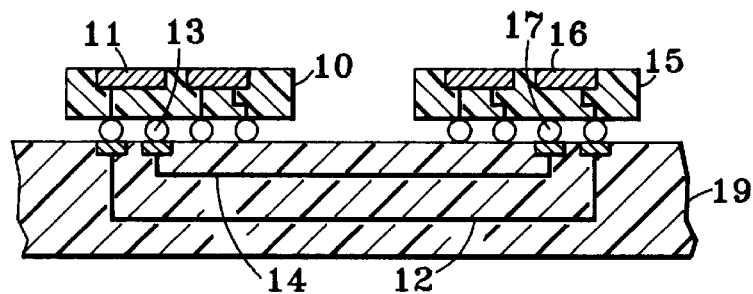
FIG. 1 shows a surplus connection created in a two-level package hierarchy.

FIG. 1 illustrates the engineering change anticipation method as applied to a two-level package hierarchy, involving only chips and a module. Integrated chips 10 and 15 are each mounted on a module 19, with connections between the chips made within the module.

Once the first pass of the design is complete and before manufacture has begun, area 11 on the top surface of chip 10 of integrated circuit chip 10 is targeted by the designer as likely to be susceptible to future changes. For example, bus control lines are frequently subject to change, while a clock circuit is a relatively stable design. The changes involved can be repairs to fix problems, or even potential functional enhancements.

After the target area 11 is identified, according to the existing design, connection 12 is in turn likely to change if target area 11 changes. The termination point for connection 12 is end point 16 on the top surface of chip 15, which in this case is an area in integrated circuit chip 15.

Next a surplus I/O on each chip is chosen. On chip 10, I/O connector pin 13 on the bottom surface of chip 10 is surplus, and can potentially be connected to target area 11 when needed. On chip 15, surplus I/O connector pin 17 on bottom surface of chip 15 likewise can potentially be connected to end point 16 when needed.

Finally, a surplus connection 14 is created between surplus I/O pins 13 and 17 through module 19. After the design is manufactured, if area 11 requires a change (for example a repair or engineering change), the change is completed via chip ECs to connect area 11 to I/O pin 13, and end point 16 to I/O pin 17. Thus the once surplus connection becomes a logical connection carrying a logical signal. The chip EC takes only a few days using the fixed ion beam process using two connection adds in connect areas 11 and 16 . This compares very favorably with a module EC which can take approximately 3 months.

Note that the entire chip and not just an area of the chip could be determined to be susceptible to change, and more than one connection could be likely to change as a result. In that case, as many spare connections as feasible would be established.

Figure 2:
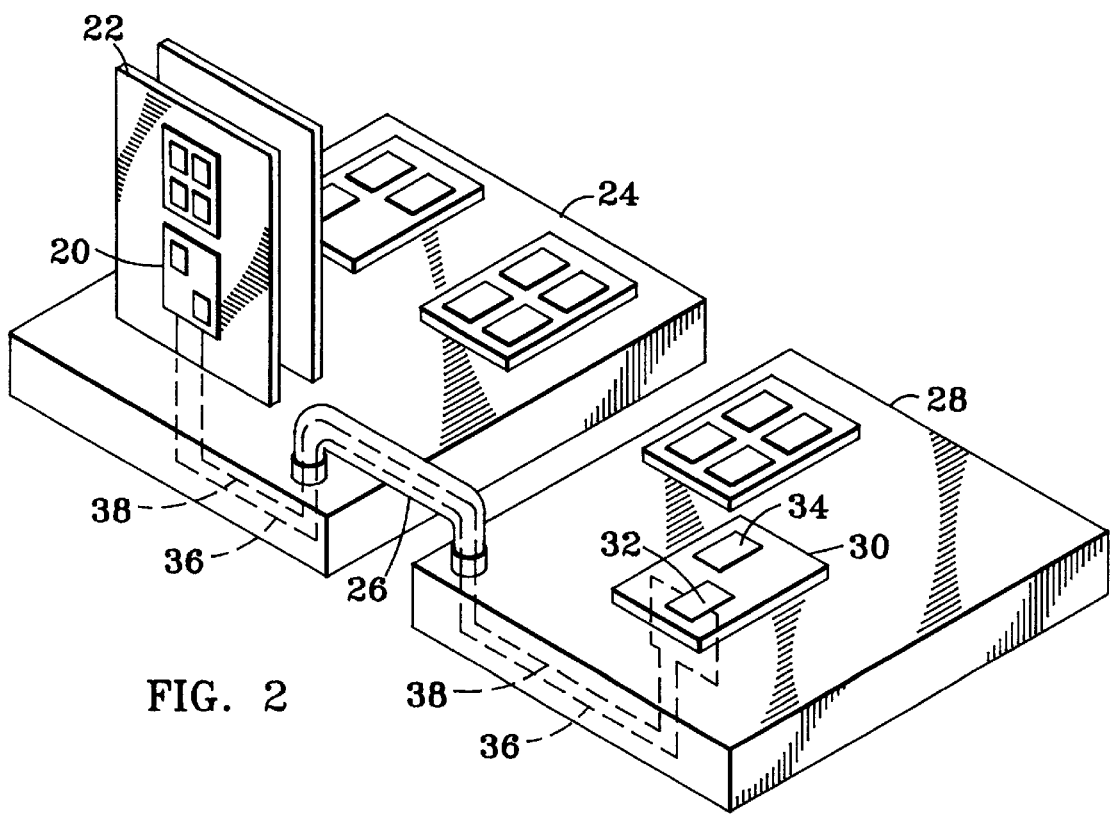
FIG. 2 shows a surplus connection created in a four-level package hierarchy.

FIG. 2 illustrates the method as applied to a four level packaging hierarchy. For example, IBM ES/9000 boards support multiple levels of packaging concurrently. Here the four levels are chips, modules, cards, and boards. In this design, the target area for future change is module 20.

The connection likely to change for module 20 is connection 36. The endpoint for connection 36 is chip 32, on board 28. For the module 20-chip 32 surplus connection, surplus I/Os on module 20 and chip 32 are chosen. In order to connect the I/Os, surplus I/Os are also chosen in lower levels of packaging, namely card 22, board 24, cable 26, board 28, and module 30. The optimal surplus connection thus connects module 20 to card 22, card 22 to board 24, board 24 to board 28 through cable 26, board 28 to module 30, and module 30 to chip 32, all using surplus I/O.

Note that a less than optimal surplus connection can be made if the design does not allow for an optimal surplus connection. For example, chip 32 can be connected through module 30 to chip 34, and chip 34 connected through module 30 to board 28. This can happen if the module design is too crowded with wires to permit an optimal connection. Alternatively, the overall surplus connection strategy between levels may make it advantageous to plan less than optimal connections. For example, if a designer wants all four chips on a four chip module to have surplus connections to off-module end points, the designer may choose to surplus wire three of the chips into the fourth chip, and make a surplus connection from only the fourth chip to the off-module end points. Note also that this invention allows surplus connections to be established between or among any two or more packaging levels in an integrated circuit package. If the design permits, surplus connections can be made via the use of surplus I/O between each circuit package and every other circuit package, without the need for choosing the areas with the highest likelihood for change.

Figure 3:
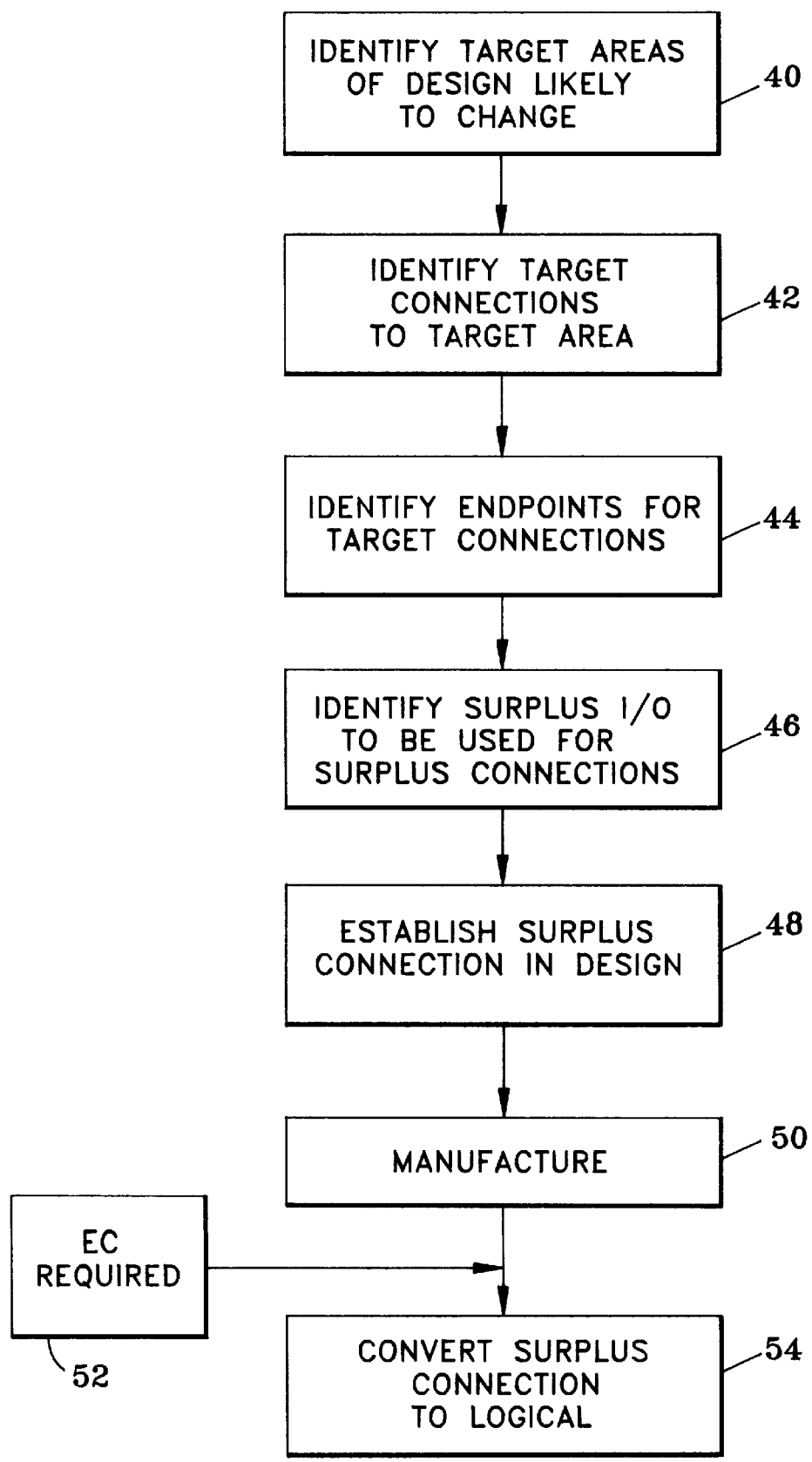
FIG. 3 shows the EC anticipation method in flowchart format.

FIG. 3 shows the engineering change anticipation method in flowchart form. In block 40, the target areas of the design which are likely to change are identified. Next, the target connections to the target area are identified in 42. Then the endpoints for those target connections are identified in 44. The surplus I/O to be used for the surplus connections are identified in 46, and the surplus connections are established in 48. After the design is manufactured in block 50, an EC requirement in 52 will result in a surplus connection being converted to a logical connection in block 54.

The decrease in time required to make an EC involving the target area using the new method is even more dramatic in this case, because a board EC has the longest EC turnaround time, which can exceed 9 months for a Clark board or other similar boards, for example. Instead of being gated by the board or card EC, the gate is now the module EC. (The chip EC can be completed faster than the module EC.)

The above examples are relatively simple in the circuit design world. In reality, many areas will be designated as likely to change, and many surplus I/Os will be present in a design. Designers can use design automation software to support the assignment of spare I/O and connections during the design and manufacture process as well as the conversion from surplus to logical connection during the EC process.

While the preferred embodiments of the invention have been described, it will be understood that those skilled in the art, both now and in the future, may make various improvements and enhancements which fall within the scope of the claims which follow. These claims should be construed to maintain the proper protection for the invention first disclosed.

What is claimed is:

1. A method for preparing for engineering changes between a plurality of circuit packages of a multiple level circuit package, to anticipate the engineering chances required during a course of manufacture and to facilitate those changes when required, the method comprising performing the steps as follows:

(a) identify a connection point target area as susceptible to future chance in accordance with a design of said multiple level circuit package, said target area being disposed on a top surface of a first circuit package above a first connector on a bottom surface of said first circuit package, and (b) identify a connection end point on a top surface of a second circuit package above a second connector on a bottom surface of said second circuit package of said multiple level circuit package, and (c) establish a surplus connection between said first connector and said second connector to prepare for potential connection between said target area and said end point, (d) then determine whether an interconnection between said target area and said end point is required, and (e) if a determination is made that said interconnection is required, then making a connection between said target area and said first connector and making a connection between said end point and said second connector, thereby converting said surplus connection into a logical connection between said target area and said end point, steps (a), (b) and (c) being performed prior to manufacture of the multiple level circuit package and steps (d) and (e) being performed after manufacture of the multiple level circuit package.

2. The method of claim 1 wherein the first circuit package is selected from the group consisting of integrated circuit chips, integrated circuit module, printed circuit card, and printed circuit board.

3. The method of claim 2 wherein the second circuit package is selected from the group consisting of integrated circuit chips, integrated circuit module, printed circuit card, and printed circuit board.

4. A method for facilitating engineering changes required during a course of manufacture of a plurality of circuit packages, the method comprising the steps of:

identifying a target area on a top surface of a first circuit package, said target area being identified as susceptible to future change in accordance with a design of said first circuit package;

identifying a target connection to said target area;

identifying an end point on a top surface of a second circuit package for said target connection, said end point being above a connector on a bottom surface of said second circuit package;

identifying a first surplus connection point on a bottom surface of said first circuit package for potential future connection to the target area;

identifying a second surplus connection point on a bottom surface of said second circuit package for potential future connection to said end point; and establishing a surplus connection between said first surplus connection point and second surplus connection point for use in potential connection between said target area and said end point, then determining whether an interconnection between said target area and said end point is required, and if a determination is made that said interconnection is required, then making a connection between said target area and said first connection point and making a connection between said end point and said second connection point, thereby converting said surplus connection into a logical connection between said target area and said end point, said identifying steps and said establishing step being performed prior to manufacture of said circuit packages.

5. A method for facilitating an engineering change between circuit packages of a multiple level circuit package, comprising the steps of:

(a) identifying a target area on a top surface of a first circuit package, said target area being identified as susceptible to future change in accordance with a design of said first circuit package;

(b) identifying a target connection to the target area;

(c) identifying an end point on a top surface of a second circuit package for the target connection;

(d) identifying a first surplus connection point on a bottom surface of said first circuit package for potential future connection to the target area;

(e) identifying a second surplus connection point on a bottom surface of said second circuit package for potential future connection to the end point;

(f) establishing a surplus connection between the bottom surface of said first circuit package and the bottom surface of said second circuit package between said first surplus connection point and second surplus connection point without forming a connection to said top surface of said first circuit package and without forming a connection to said top surface of said second circuit package;

(g) then manufacturing the multiple level circuit package;

(h) then determining whether an interconnection between said target area and said end point is required, and (i) if a determination is made that said interconnection is required, then making a connection between said target area and said first surplus connection point and making a connection between said end point and said second surplus connection point, thereby converting said surplus connection into a logical connection between said target area and said end point, steps (a), (b), (c), (d), (e) and (f) being performed prior to manufacture of the multiple level circuit package, and steps (h) and (i) being performed after manufacture of the multiple level circuit package.

6. The method of claim 5 wherein said first circuit package is contained in the group of integrated circuit chips, integrated circuit module, printed circuit card, and printed circuit board.

7. The method of claim 6 wherein said second circuit package is contained in the group of integrated circuit chips, integrated circuit module, printed circuit card, printed circuit board.

8. The method of claim 5 wherein the step (i) further comprises the steps of:

completing the engineering change to connect said first surplus connection point to said target area; and completing the engineering change to connect said second surplus connection point to said end point.

9. A method for implementing anticipated engineering changes between a plurality of circuit packages of a multiple level circuit package, the method comprising the steps of:

(a) identifying a first surplus connection point on a top surface of a first circuit package above a first connector on a bottom surface of said first circuit package, said first surplus connection point being identified as susceptible to future change in accordance with a design of said multiple level circuit package;

(b) identifying a second surplus connection point on a top surface of a second circuit package above a second connector on a bottom surface of said second circuit package;

(c) establishing a surplus connection between said first surplus connection point and said second surplus connection point; and (d) implementing the anticipated change by making two connection adds, steps (a) and (b) being performed prior to manufacture of said multiple level circuit package, step (c) being performed during manufacture of said multiple level circuit package, and step (d) being performed after manufacture of said multiple level circuit package.

10. A method for anticipating engineering changes between a plurality of circuit packages of a multiple level circuit package, the method comprising the steps of:

(a) identifying a first surplus connection point on a top surface of a first circuit package above a first connector on a bottom surface of said first circuit package, said first surplus connection point being identified as susceptible to future change in accordance with a design of said multiple level circuit package;

(b) identifying a second surplus connection point on a top surface of a second circuit package above a second connector on a bottom surface of said second circuit package; and establishing a surplus connection between said first surplus connection point and said second surplus connection point by connecting from said first surplus connection point to said first connector and connecting from said second surplus connection point to said second connector, where said first connector and said second connector are interconnected, said surplus connection being made using one I/O per circuit package, steps (a) and (b) being performed prior to manufacture of said multiple level circuit package and step (c) being performed during manufacture of said multiple level circuit package.

* * * * *